United States Patent [19]

Moravec et al.

[11] 4,176,208
[45] Nov. 27, 1979

[54] PRODUCTION OF INHOMOGENEOUS FILMS BY SEQUENTIAL LAYERS OF HOMOGENEOUS FILMS

[75] Inventors: Thomas J. Moravec, Eden Prairie; Richard A. Skogman, Minneapolis, both of Minn.

[73] Assignee: Honeywell Inc., Minneapolis, Minn.

[21] Appl. No.: 963,550

[22] Filed: Nov. 24, 1978

[51] Int. Cl.$^2$ ............................. G02B 1/10; B05D 1/36
[52] U.S. Cl. ...................................... 427/160; 427/162; 427/164
[58] Field of Search ......................... 427/160, 162, 164

[56] References Cited

U.S. PATENT DOCUMENTS

| | | | |
|---|---|---|---|
| 3,959,548 | 5/1976 | Bernal | 427/164 X |
| 4,009,300 | 2/1977 | Chaffin | 427/162 |
| 4,110,489 | 8/1978 | Chaffin et al. | 427/160 X |

Primary Examiner—James R. Hoffman
Attorney, Agent, or Firm—Omund R. Dahle

[57] ABSTRACT

The present invention directed to antireflective coatings presents a new method for producing graded index films from alternating very thin layers of two materials with proper but differing indices. During deposition the thickness of each of the many layer pairs deposited can remain fairly uniform while the layer thickness of the two materials making up each pair is adjusted so that the resulting average index matches the index of the desired profile for that part of the total thickness. A two source evaporation deposition system is used and the two materials may be, for example, thallium iodide and lead fluoride.

9 Claims, 5 Drawing Figures

PRODUCTION OF INHOMOGENEOUS FILMS BY SEQUENTIAL LAYERS OF HOMOGENEOUS FILMS

ORIGIN OF THE INVENTION

The present invention was made under a contract with the Department of Defense.

BACKGROUND AND SUMMARY OF THE INVENTION

This invention is concerned with surface protection of water soluble halide solids for use as optical components in infrared systems and particularly to providing graded index coatings of cubic thallium iodide and lead fluoride. Inhomogeneous optical thin film coatings are known to exhibit desirable spectral characteristics, e.g. broadband antireflective coatings for solar absorbers and solar cells. These characteristics require a particular smooth variation of the refractive index or gradient throughout the film which is difficult to produce accurately and reproducibly. This invention makes it possible to accurately reproduce a refractive index gradient from two materials with different refractive indices by dividing the gradient up into small (compared to the wavelength of light of interest) increments of homogeneous films which are evaporated sequentially.

One of the more critical problems encountered in the development of high power infrared lasers is the development of laser windows which are highly transparent to laser radiation at 10.6 microns and at 3 to 5 microns.

The need for improved laser windows is based on the extremely high laser power throughput required and the fact that laser windows constitute structural members. In order to maintain high throughput and minimize adverse effects, the amount of energy transferred to the window must be kept low. Laser beam energy can be transferred to the window in two ways: heating of the window caused by either bulk or surface absorption of the beam, or direct conversion of the beam energy to mechanical energy by brillouin scattering or electrostriction. This energy transfer produces several undesirable effects such as lensing and birefringence, which result in degradation of beam quality and polarization. In extreme cases, severe thermal stresses can be produced in the windows. These stresses, which are further aggravated by the fact that the windows are mounted in a cooling clamp, may lead to fracture of the windows.

The low absorption coefficients of the halides make them outstanding candidates for optical components in infrared systems. The alkali halides exhibit low absorption at 10.6 microns, and the alkaline earth halides exhibit low absorption in the 2 to 6 micron region. Furthermore, because the temperature coefficient of the index of refraction and the coefficient of thermal expansion have opposite signs for these materials, the two effects tend to compensate optical path changes due to temperature, making these materials useful in applications which heating by a laser beam is anticipated. A limiting factor in the use of halides, however, is that many halides, in particular the alkali halides, have the undesirable property of being water soluble and cannot, therefore, be used in humid environment.

Despite extensive research efforts, the problems of anti-reflective (AR) surface protection still has problems to overcome. In the earlier efforts the conventional coating methods for sealing the surface of the halide solid from environmental humidity have generally failed for one of two reasons. First, the coatings lose their integrity during thermal cycling because of differences of coefficient of thermal expansion between the coating material and the substrate. This is a serious problem because the large coefficient of thermal expansion of halides tends to result in coatings that are in tension. It has not been uncommon for the protective coating to peel off a halide window during use. Second, the coating material is sufficiently opaque in the infrared to negate the extremely low optical loss which makes the halides attractive. Subsequently, the advantages of thallium iodide films for surface protection have been described in other patents assigned to the same assignee as the present invention, one U.S. Pat. No. 3,959,548 entitled "Graded Composition Coatings for Surface Protection of Halide Optical Elements", another U.S. Pat. No. 4,009,300 entitled "Preparation of Graded Composition Protective Coatings", and U.S. Pat. No. 4,110,489 entitled "Preparation of Low Absorption Transparent Thallium Iodide Films on Potassium Chloride".

Thallium iodide is naturally birefringent, however owing to its orthorhombic crystal structure, and thallium iodide thin films on potassium chloride optical elements tend to scatter light due to the birefringent nature of thallium iodide. In the U.S. Pat. No. 4,110,489 the thallium iodide was condensed in its cubic phase on potassium chloride and allowed to transform to its stable orthorhombic phase. That improvement did not eliminate the birefringence but did reduce scattering. Investigation has established that thallium iodide does exist in a non-birefringent cubic form at atmospheric pressure above about 170° C. and at room temperature at a pressure of about 5K bar. Alloys of thallium iodide can also exist in cubic form, i.e. thallium bromo-iodide. For most optics applications, however, thallium iodide films cannot be used at 170° C. or at 5K bar pressure. Alloying of thallium iodide degrades its desirable properties of high infrared transparency and low water solubility.

In our co-pending application entitled "Non-Birefringent Thallium Iodide Thin Films for Surface Protection of Halide Optical Elements" there is provided an improved method for making pure (unalloyed) cubic thallium iodide thin films. That invention provides thin films of thallium iodide to be cubic at room temperature and atmospheric pressure ambient, and employs neither elevated substrate temperatures, high pressures, or alloying to obtain cubic thallium iodide films. The thallium iodide films made by the method of that invention are highly transparent, insoluble, and non-scattering. The method of that invention is to deposit thin alternating layers of thallium iodide and some other buffer material, such as lead fluoride in a programmed manner such that a composite coating is obtained.

In the present invention there is presented a new method for producing graded index films from alternating very thin layers of two materials. During deposition the thickness of the layers is adjusted so that the resulting average index matches the index of the profile for that total thickness. We use a two source evaporation with changing thickness in progressive steps.

DESCRIPTION

Figure 1:
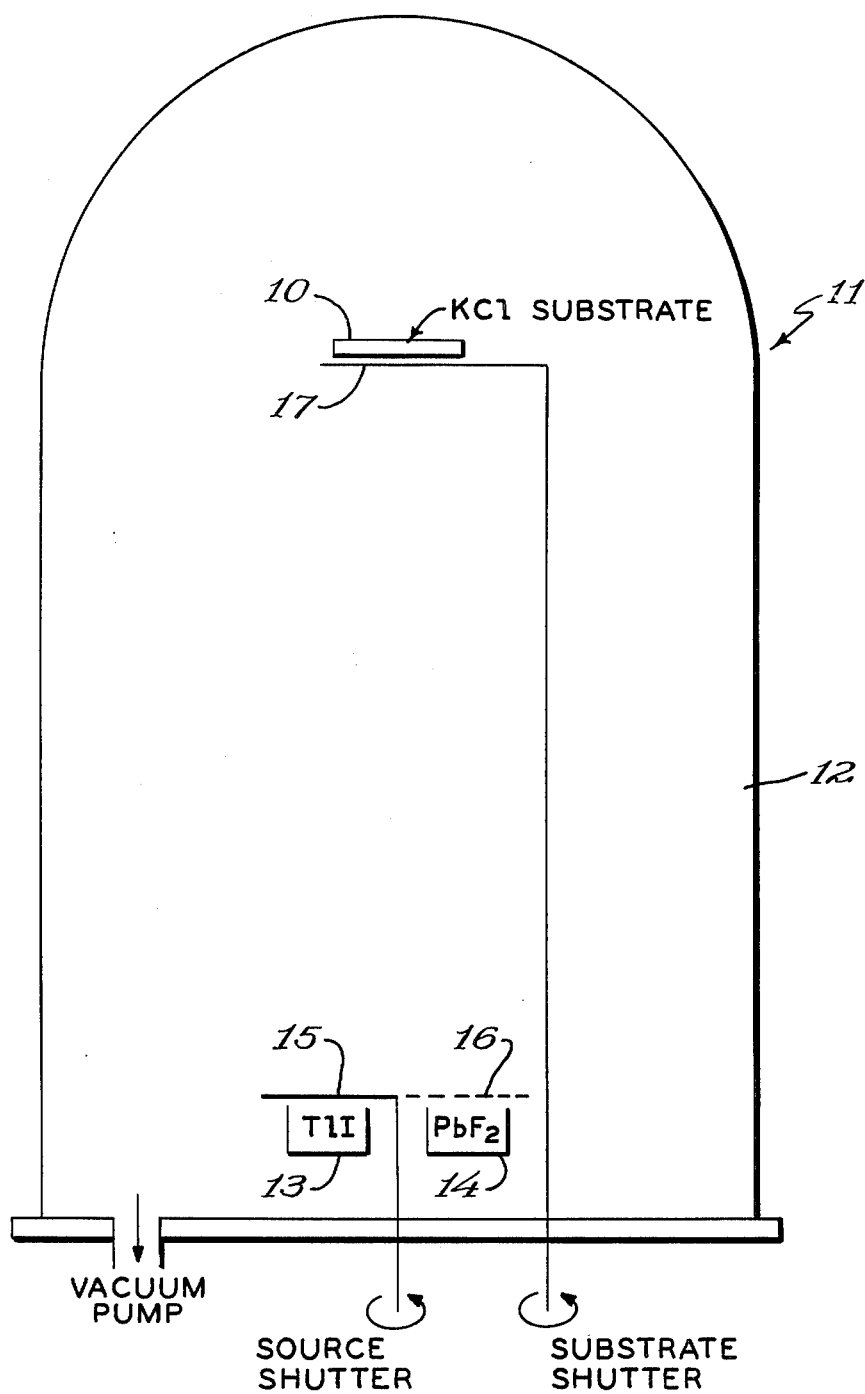
FIG. 1 is a diagrammatic representation of the essential equipment required for thin film deposition by thermal evaporation of alternate layers of thallium iodide and lead fluoride.

The halide optic body to be coated, such as a potassium chloride window or lens 10 is placed in a thin film vacuum deposition system 11 as shown diagrammatically in simplified form in FIG. 1. The system comprises an evacuable envelope 12 such as a bell jar having therein a thallium iodide evaporation source 13 and a lead fluoride evaporation source 14 positioned to cause deposition on element 10. A movable shutter 15 having an alternate position 16 shields the substrate 10 from source 13 or source 14, respectively, the shutter being selectively adjustable to open one or the other sources as desired. A substrate shutter 17 is movable to open the substrate to the evaporant stream. The evaporation sources 13 and 14 include the evaporant in a boat and suitable heating elements such as resistance heaters to maintain the temperature of the evaporants to provide the desired deposition rates.

Figure 2:
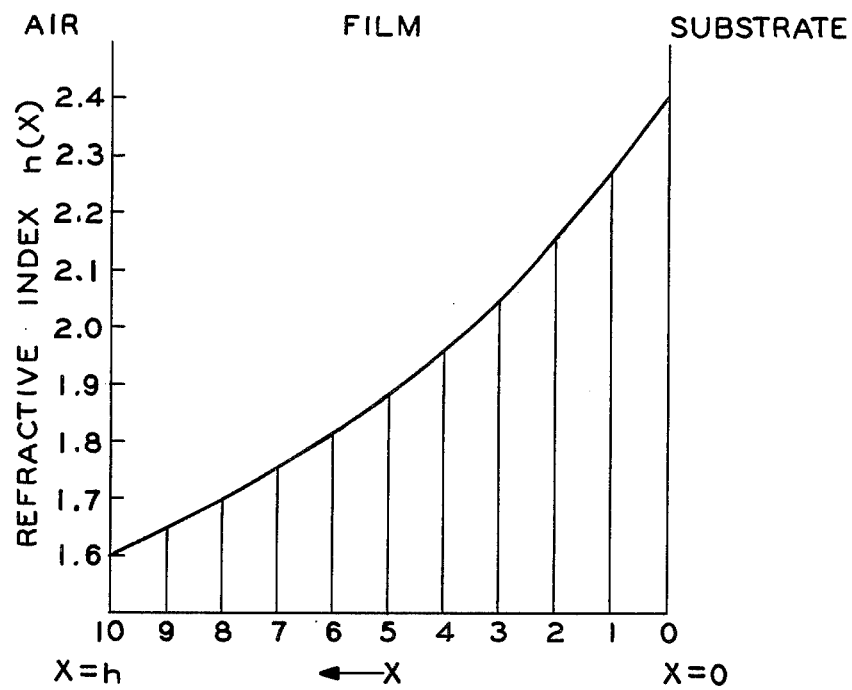
FIG. 2 is a graphical representation of refractive index gradient through the film.

We have developed a method that will produce graded index films without rate variations. The procedure is as follows. We desire that an inhomogeneous film be made with its refractive index gradient some $n(x)$, where x is the distance measured from the substrate interface as shown in FIG. 2. The total thickness of the film is h and the film should have an index of $n_a$(e.g., =2.4) next to the substrate and $n_b$(e.g., =1.6) next to the air/film interface. To make this film by our method, we divide up the film into steps, for example of width h/10, with each step having an average index determined by the particular form of the gradient, $n(x)$, such as exponential, hyperbolic, etc. The average index for step 1 (for x=0 to x=1) in our example is 2.32 as taken from the graph of FIG. 2. We call this value $n_1$. We produce this average index for thickness of increment width h/10 by evaporation first one layer that is $d_1$ thick material with index $n_a(=2.4)$. This is followed by one layer of thickness $(h/10-d_1)$ of material with index $n_b(=1.6)$ such that $$d_1 n_a + (h/10 - d_1)n_b = n(h/10) \quad (1)$$

or $$d_1 = 0.9(h/10) \text{ and } (h/10-d_1)=0.1(h/10) \quad (2)$$

Figure 3:
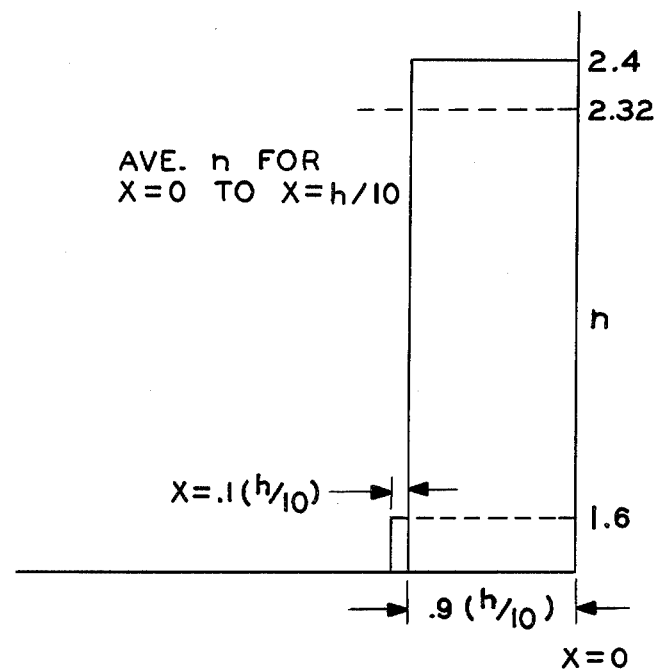
FIG. 3 is a graphical schematic of first step layer to produce the index profile of FIG. 2.

This first step layer is shown schematically in FIG. 3, where to produce the index profile of FIG. 2 we provide a sequential evaporation of material $n_a$ of thickness 0.9(h/10) followed by evaporation of material $n_b$ of thickness 0.1(h/10). The average index for the combined thickness of (h/10) is 2.32 as desired.

Thus for all $<n_i>$, $i=1$ to 10, the average indices, the thickness required of the discrete layers of the two materials are given by $$d_i n_a + (h/10 - d_i)n_b = h/10 <n_i>; i=1 \text{ to } 10 \quad (3)$$

This can be generalized for M increments in H as $$d_i n_a + (H/M - d_i)n_b = (H/M)<n_i>; i=1 \text{ to } M \quad (4)$$

Thus the sequences of high and low index materials are repeated from substrate to air interface each time the appropriate thickness of the two layers is adjusted, so that the average index is equal to $n(x)$ for that value of x in the index profile. Obviously, a smoothly varying index profile can be approximated very well by small increments (say h/1000 or 10 Å for typical optical coatings). Our laboratory films were produced with M=50 to 100.

The advantage of this method over methods that vary the rates of the two sources, or mix the materials together before evaporation, is that very complicated index profiles $n(x)$ can be easily reproduced. This is because accurate control of the two rates is not required as it is for methods that vary the rates to obtain inhomogeneous coevaporated films. This method also lends itself easily to automated control via feedback from a thickness monitor coupled with an automated shutter.

Films prepared by the above method were subject to ESCA (electron spectroscopy for chemical analysis) depth profiling to insure that the films were graded in composition and from the results of the analysis the films appear smoothly graded.

Figure 4:
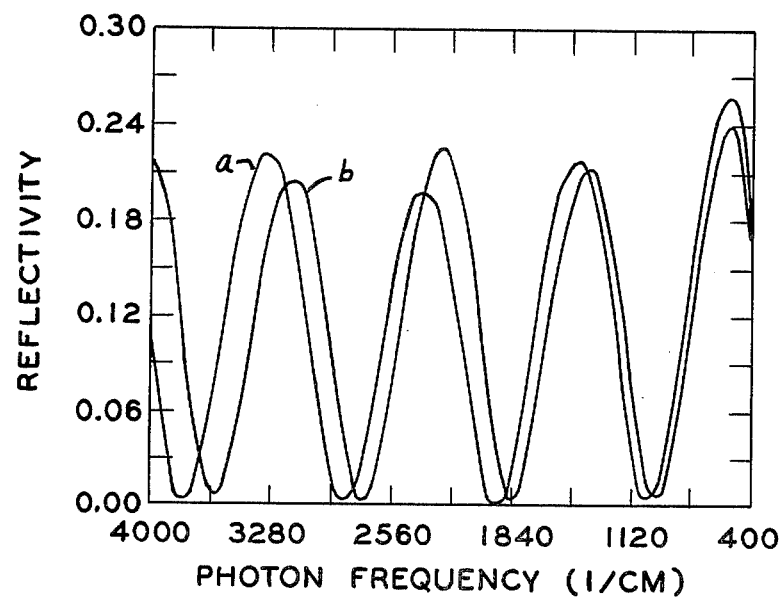
FIGS. 4 and 5 are reflectivity curves.
Figure 5:
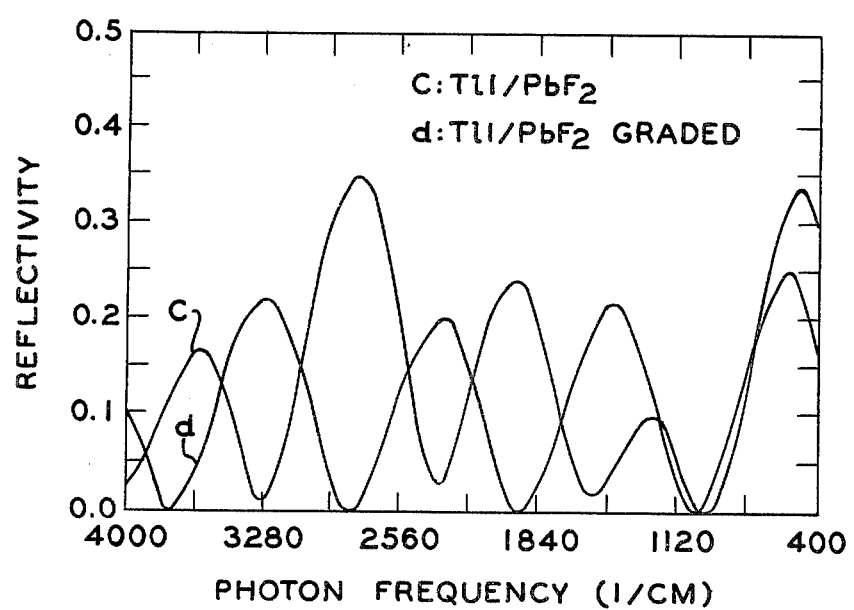

FIG. 4 shows the near infrared reflectivity for two graded index thallium iodide lead fluoride films on KCl taken with a prism on the back surface to remove that reflection. Curve a is a 2.5 μm thick film made by the step method of the present invention and curve b is a 2.6 μm film made in a conventional manner by varying the rates with a mechanical shutter. The curves are fairly similar with their minima displaced due to different thicknesses and possibly to variation in the gradation. An interesting feature is that every minimum besides the one near 10 μm is very antireflecting, and this agrees with theoretical projection. Other graded index films displayed curves similar to these. This spectra can be compared to that of a two layer conventional "Vee" design AR coating that has only one AR minimum (and thus a "Vee" in the spectral reflectivity) as can be seen from FIG. 5. Curve c is the two layer, and curve d (film produced by mechanical shutter) the graded index reflectivity in the near infrared.

The embodiments of the invention in which an exclusive property or right is claimed are defined as follows:

1. Preparation of a graded refractive index in an optical film antireflective coating on an optical element comprising the steps of:
    (a) provide an evaporative vacuum deposition system having first and second evaporation sources of different optical coating materials of differing indices of refraction such that the values of the two indices satisfy the relationship for antireflecting characteristics at the desired wavelength;
    (b) provide a shutter for the evaporant sources;
    (c) place an optical element to be coated in said evaporative deposition system;
    (d) evacuate the vacuum deposition system to $5 \times 10^{-6}$ torr pressure or lower;
    (e) heat the evaporant sources to obtain desired deposition rates;
    (f) deposit a plurality of thin film layer pairs of the two materials, that is, the first material followed by the second material onto the optical element, the first of the layer pairs having the second material thin compared to the first material, the last of the layer pairs having the first material thin with respect to the second material, and the other layer pairs shifting between the thin second material and the thin first material relation in a predetermined manner to thereby provide a desired graded refractive index film.

2. The process according to claim 1 in which each of the layer pairs is on the order of 300 Å in thickness.

3. The process according to claim 1 in which the first evaporation source consists of thallium iodide and the second evaporation source consists of lead fluoride.

4. The process according to claim 3 in which each of the plurality of layer pairs are about 300 Å in thickness and the first layer pair comprises:

deposit a layer of thallium iodide to a thickness of about 275-300 Å followed by a lead fluoride layer to a thickness of about 5 to 25 Å and in which the last of the layer pairs comprises:

deposit a layer of thallium iodide to a thickness of about 5 to 25 Å followed by a lead fluoride layer to a thickness of about 275-300 Å.

5. The process according to claim 1 in which step (f) is continued to any number of iterations of thick first material to thin first material for any number of oscillations so that complicated graded refractive index profiles are achieved.

6. Preparation of a graded refractive index in an optical thin film coating of thallium iodide and lead fluoride on a potassium chloride optical element comprising the steps of:

(a) provide an evaporative vacuum deposition system having therein a thallium iodide evaporation source and an optical buffer material evaporation source;

(b) provide a shutter for the evaporant sources;

(c) place a potassium chloride optical element to be coated in said evaporative deposition system;

(d) evacuate the vacuum deposition system to $5 \times 10^{-6}$ torr pressure or lower;

(e) heat the evaporant sources to obtain deposition rates of not more than about 2000 Å per minute from each;

(f) deposit a plurality of layer pairs of thallium iodide followed by lead fluoride onto the potassium chloride optical element, the first of the layer pairs having the lead fluoride thin compared to the thallium iodide, the last of the layer pairs having the thallium iodide thin with respect to the lead fluoride, and the other layer pairs progressively shifting from the thin lead fluoride to the thin thallium iodide relation to thereby provide a graded refractive index film.

7. The process according to claim 6 in which each of the layer pairs is on the order of 300 Å in thickness.

8. The process according to claim 6 in which the layer pairs are about 300 Å in thickness and the first layer pair comprises:

deposit a layer of thallium iodide to a thickness of about 275-300 Å followed by a lead fluoride layer to a thickness of about 5 to 25 Å and in which the last of the layer pairs comprises: deposit a layer of thallium iodide to a thickness of about 5 to 25 Å followed by a lead fluoride layer to a thickness of about 275-300 Å.

9. The process according to claim 6 in which the step (f) is continued to any number of iterations of thick thallium iodide to thin thallium iodide for any number of oscillations so that complicated graded refractive index profiles are achieved.

* * * * *